United States Patent
Lamesch

(10) Patent No.: US 10,124,758 B2
(45) Date of Patent: Nov. 13, 2018

(54) LOW-COST COMPLEX IMPEDANCE MEASUREMENT CIRCUIT FOR GUARD-SENSE CAPACITIVE SENSORS OPERATED IN LOADING MODE

(71) Applicant: IEE INTERNATIONAL ELECTRONICS & ENGINEERING S.A., Echternach (LU)

(72) Inventor: Laurent Lamesch, Reichlange (LU)

(73) Assignee: IEE INTERNATIONAL ELECTRONICS & ENGINEERING S.A., Echternach (LU)

( * ) Notice: Subject to any disclaimer, the term of this patent is extended or adjusted under 35 U.S.C. 154(b) by 0 days.

(21) Appl. No.: 15/521,180

(22) PCT Filed: Oct. 22, 2015

(86) PCT No.: PCT/EP2015/074533
§ 371 (c)(1),
(2) Date: Apr. 21, 2017

(87) PCT Pub. No.: WO2016/062824
PCT Pub. Date: Apr. 28, 2016

(65) Prior Publication Data
US 2017/0355337 A1 Dec. 14, 2017

(30) Foreign Application Priority Data
Oct. 22, 2014 (LU) ......................... 92582

(51) Int. Cl.
*B60Q 1/00* (2006.01)
*G08B 13/26* (2006.01)
(Continued)

(52) U.S. Cl.
CPC ........ *B60R 21/01532* (2014.10); *B60N 2/002* (2013.01); *G01D 5/24* (2013.01);
(Continued)

(58) Field of Classification Search
CPC ............ B60R 21/01532; B60R 21/015; B60R 21/01516; B60R 21/0154; B60N 2/002;
(Continued)

(56) References Cited

U.S. PATENT DOCUMENTS 3,524,017 A * 8/1970 Pezirtzoglou ........ G11B 5/0086
360/46
4,820,971 A * 4/1989 Ko ........................... G01D 5/24
324/607
(Continued)

FOREIGN PATENT DOCUMENTS

EP 2036780 A1 3/2009
JP H1178655 A 3/1999
(Continued)

OTHER PUBLICATIONS

J. Smith et al., "Electric Field Sensing for Graphical Interfaces." IEEE Computer Graphics and Applications, May/Jun. 1998, pp. 54-60.
(Continued)

*Primary Examiner* — Curtis King
(74) *Attorney, Agent, or Firm* — Reising Ethington P.C.

(57) ABSTRACT

A microcontroller uses a combination of several synchronized PWM outputs to generate a low distortion sine wave by summing the PWM outputs and filtering the summed signal. The sine wave is used as a guard voltage. The unknown impedance is measured by impinging the guard voltage on the sense electrode by a transistor connected in common base configuration and then transferring the sense current through the common base connected transistor to a transimpedance amplifier made out of a second transistor connected in common emitter configuration. The output voltage at the collector of the second transistor is measured by an ADC input of the microcontroller. The microcontroller translates the ADC output values into the unknown imped-
(Continued)

ance to be measured by doing a software demodulation of the ADC output values. A reference impedance can be connected in parallel to the unknown impeder to eliminate gain errors of the signal sensing circuit.

16 Claims, 4 Drawing Sheets

(51) Int. Cl.
G08B 21/00 (2006.01)
B60R 21/015 (2006.01)
B60N 2/00 (2006.01)
G01D 5/24 (2006.01)

(52) U.S. Cl.
CPC ............ H03K 2217/960735 (2013.01); H03K 2217/960765 (2013.01)

(58) Field of Classification Search
CPC .. B60N 2/5678; B60N 2/5685; G10R 31/024; G10R 19/16528; A47C 7/748; G01D 5/2405; G01D 5/24; G10L 1/144; H03K 17/955; H03K 17/962; H03K 2217/960705; H03K 2217/960765; H03K 2217/960735; H03K 2217/960755; H03K 2217/960775; H03K 2217/960745; H03K 2217/96074; H03K 2217/9607; H03K 2217/96072; H03K 2217/96073

See application file for complete search history.

(56) References Cited

U.S. PATENT DOCUMENTS

| | | | | |
|---|---|---|---|---|
| 5,134,485 A * | 7/1992 | Binns | ............... | H04N 5/40 348/723 |
| 7,129,714 B2 * | 10/2006 | Baxter | ............... | G01D 5/24 324/658 |
| 7,449,895 B2 * | 11/2008 | Ely | ............... | G06F 3/044 324/678 |
| 7,656,169 B2 * | 2/2010 | Scheckenbach | ....... | B60N 2/002 280/735 |
| 7,796,017 B2 * | 9/2010 | Kiribayashi | ........... | B60N 2/002 280/734 |
| 8,882,142 B2 * | 11/2014 | Lamesch | ............... | B60N 2/002 180/271 |
| 8,896,325 B2 * | 11/2014 | Gecnuk | ............... | H03K 17/955 324/382 |
| 9,257,980 B2 * | 2/2016 | Lundstrum | ........ | H03K 17/9622 |
| 9,542,051 B2 * | 1/2017 | Davison | ............... | H03K 17/962 |
| 9,561,768 B2 * | 2/2017 | Lamesch | ............... | B60N 2/002 |
| 2002/0038947 A1 | 4/2002 | Baba et al. | | |
| 2002/0177942 A1 * | 11/2002 | Knaian | ............... | G08G 1/02 701/117 |
| 2006/0203263 A1 * | 9/2006 | Komiya | ............... | H04N 1/1135 358/1.7 |
| 2008/0061800 A1 * | 3/2008 | Reynolds | ........... | G01R 27/2605 324/678 |
| 2008/0116050 A1 * | 5/2008 | Lin | ............... | G01D 5/165 200/600 |
| 2008/0116904 A1 * | 5/2008 | Reynolds | ............... | G06F 3/0416 324/678 |
| 2008/0186034 A1 | 8/2008 | Scheckenbach et al. | | |
| 2009/0126513 A1 * | 5/2009 | Park | ............... | B60R 21/01532 73/862.626 |
| 2011/0121761 A1 * | 5/2011 | Zhao | ............... | H05B 33/0818 315/312 |
| 2011/0273194 A1 * | 11/2011 | Aubry | ............... | H03K 17/955 324/686 |
| 2013/0141121 A1 * | 6/2013 | Lamesch | ............... | H03K 17/955 324/681 |
| 2013/0334844 A1 * | 12/2013 | Lamesch | ............... | B60N 2/002 297/180.12 |
| 2014/0367522 A1 * | 12/2014 | Stonestreet, II | ....... | B64D 15/14 244/134 D |
| 2016/0075297 A1 * | 3/2016 | Lamesch | ............... | B60N 2/002 324/603 |
| 2018/0037137 A1 * | 2/2018 | Goedert | ............... | B60N 2/002 |

FOREIGN PATENT DOCUMENTS

| WO | WO9928702 A1 | 6/1999 |
|---|---|---|
| WO | WO2012113833 A1 | 8/2012 |
| WO | WO2014166881 A1 | 10/2014 |

OTHER PUBLICATIONS

International Search Report for International application No. PCT/EP2015/074533, dated May 1, 2016, 4 pages.
Written Opinion for International application No. PCT/EP2015/074533, dated May 1, 2016, 7 pages.

* cited by examiner

LOW-COST COMPLEX IMPEDANCE MEASUREMENT CIRCUIT FOR GUARD-SENSE CAPACITIVE SENSORS OPERATED IN LOADING MODE

TECHNICAL FIELD

The invention relates to a complex impedance measurement circuit for a guard-sense capacitive sensor operated in loading mode, in particular for vehicle applications, a method of measuring impedance of such capacitive sensor and a software module for carrying out the method.

BACKGROUND ART

Vehicle capacitive detection systems comprising capacitive sensors operated in loading mode are nowadays widely used, for instance for the purpose of detection of vehicle seat occupancy. The capacitive sensors may be designed as sense-only capacitive sensors having a single sense electrode. Alternatively, they may be designed as guard-sense capacitive sensors, having a sense electrode and a guard electrode proximally arranged and mutually insulated from each other.

For example, document JP-H11-78655 describes a vehicle seat occupancy detecting apparatus including electric field sensors. A high frequency oscillator whose frequency is about 100 kHz is connected via a resistor to an antenna electrode arranged on an automobile seat. By this, a differential AC electric field is generated between the antenna electrode and the automobile ground, so that a load current corresponding to the AC electric field flows through the resistor. The AC load current is converted by the resistor into an AC voltage which is then transmitted by a voltage buffer to a detector including a bandpass filtering function which generates a DC output voltage.

If an occupant is seated on the seat, the current flowing between the antenna electrode and the automobile ground is increased, indicating the presence of the occupant on the seat.

An occupant detecting apparatus for detecting an occupant seated on the passenger seat of a vehicle is described in US application 2002/0038947. The occupant detecting apparatus comprises a plurality of electric field sensors provided in a bottom part and a rear part of the seat, and also a mechanical load sensor and an acceleration sensor. The electric field sensors are connected to a control unit comprising a high frequency oscillator, a resistor, a voltage buffer and a detector. Antenna electrodes are selected by the selectors and connected between the resistor and a voltage buffer. An analog-to-digital converter performs an analog-to-digital conversion on output signals of the selected electric field sensors. Digital output signals of the electric field sensors, the node sensor and the acceleration sensor are connected to a central processing unit, which determines a seat occupancy based on the sensor output signals, following predetermined criteria.

SUMMARY

It would be desirable to provide a simple impedance measurement circuit comprising low cost hardware components for determining a complex impedance of a guard-sense capacitive sensor operated in loading mode, in particular for use in vehicles and complying with automotive electromagnetic compatibility (EMC) requirements.

The term "impedance", as used in this application, shall be understood particularly to encompass ohmic resistance, capacitance, inductance or any arbitrary combination of these.

The term "vehicle", as used in this application, shall particularly be understood to encompass passenger cars, trucks and buses.

It is therefore an object of the invention to provide an impedance measurement circuit for determining a complex impedance of a guard-sense capacitive sensor operated in loading mode, employing less hardware parts and/or low-cost hardware parts, but still meeting automotive EMC requirements.

In one aspect of the present invention, the object may be achieved by an impedance measurement circuit for determining a complex impedance of a guard-sense capacitive sensor operated in loading mode, comprising a guard-sense capacitive sensor including an electrically conductive sense electrode and an electrically conductive guard electrode proximally arranged and mutually insulated from each other, a signal sensing circuit including a first transistor configured in common base configuration, having an input side and an output side, and a second transistor configured in common emitter configuration, having an input side and an output side and serving as a transimpedance amplifier for a signal at the output side of the first transistor, a shielded cable, connecting the sense electrode and the guard electrode with terminals of the input side of the first transistor, and a direct current (DC) bias circuit comprising at least a third transistor that is connected to the first transistor for providing a current sink to the first transistor.

The term "loading mode", as used in this application, shall be understood particularly as a mode of measuring a displacement current caused by the presence of a grounded object in proximity of a single sense electrode (cf. J. Smith et al., *Electric field sensing for graphical interfaces*, IEEE Comput. Graph. Appl., 18(3):54-60, 1998).

The terms "base, emitter and collector" of a transistor, as used in this application for brevity, shall be understood as the base terminal, the emitter terminal and the collector terminal of the transistor, respectively.

Although the terms "base, emitter and collector" are used in the disclosure of the invention, implying the use of bipolar transistors, it is also contemplated to employ field effect transistors instead of the bipolar transistors. In this case, the terms "base, emitter and collector" have to be replaced by the terms "gate, source and drain", respectively.

The term "common base configuration", as used in this application, shall be understood particularly as a configuration of a bipolar transistor in which the emitter and the base of the transistor form an input side, and the collector and the base of the transistor form an output side, such that the base is common to both input and output side.

The term "common emitter configuration", as used in this application, shall be understood particularly as a configuration of a bipolar transistor in which the base and the emitter of the transistor form an input side, and the collector and the emitter of the transistor form an output side, such that the emitter is common to both input and output side.

The impedance measurement circuit further comprises
a microcontroller, including
a processor unit,
a digital memory unit,
a microcontroller system clock, a plurality of synchronized pulse width modulation units, and an analog-to-digital converter unit, a pulse generator unit that is configured to weight and to sum output signals of the plurality of synchronized pulse width modulation units, said output signals having one test signal frequency and said output signals exhibiting a defined relative phase shift between each other, and a low-pass filter unit that is connected in series to an output of the pulse generator unit and that is configured to filter the summed output signals for generating a sinusoidal test signal of the test signal frequency at the output of the low-pass filter unit.

Such equipped microcontrollers are commercially available nowadays in many variations. The type of microcontroller that is contemplated for use in this invention is a low-cost type with very restricted capabilities.

An output line of the low-pass filter unit is connected to the base of the first transistor, and the output side of the second transistor is connected to the analog-to-digital converter unit.

The microcontroller is configured to apply a digital vector demodulation method to a voltage signal that is indicative of a sense current and digitally converted by the analog-to-digital converter unit, for determining a real part and an imaginary part of the complex impedance of the capacitive sensor, said digital vector demodulation method being executed by software within said microcontroller.

The term "vector demodulation method", as used in this application, shall be understood particularly as a method for recovering, relative to a local oscillator, the in-phase component and the quadrature component from a composite input signal. Vector demodulation means and/or methods are commonly known in the art of sensor signal processing and therefore need not be described in detail herein.

An advantage of the impedance measurement circuit is that the complex impedance of the capacitive sensor can reliably be determined with little hardware effort and cost. The vector demodulation is done entirely inside the microcontroller, by software, without the use of external components such as an external mixer.

Preferably, the test signal frequency lies in a range between 10 kHz and 500 kHz. In this frequency range, hardware components for carrying out the method are inexpensive and easy available.

In another preferred embodiment, the shielded cable comprises a shield and at least one inner conductor. The guard electrode is connected with the base of the first transistor by the shield of the shielded cable, and the sense electrode is connected with the emitter of the first transistor by the at least one inner conductor of the shielded cable. In this way, a solution for connecting the guard-sense capacitive sensor with the measurement circuit can readily be provided.

In one embodiment, a capacitor for direct current (DC) decoupling is installed between the input side of the first transistor and an end of the inner conductor of the shielded cable that is proximal to the input side of the first transistor. In this way, the influence of the leakage currents between the sense electrode and an electric circuit ground on the DC bias setting of the measurement circuit can be reduced or even eliminated. Preferably, a capacitance value of the capacitor is selected such that the impedance of the capacitor is low enough to let a signal pass substantially unattenuated at the test frequency.

In another preferred embodiment, the DC bias circuit includes a voltage divider comprising at least two resistors for controlling the base emitter voltage of the third transistor in an operational state of the circuit, wherein the collector of the third transistor is connected to the emitter of the first transistor. In this way, a DC current bias and current sink can be provided for the first transistor in a simple manner.

In yet another preferred embodiment, the direct current bias circuit further comprises a fourth transistor for compensation of temperature drift effects. The fourth transistor is connected in series between the at least two resistors of the voltage divider, and the base of the fourth transistor is connected both to the collector of the fourth transistor and to the base of the third transistor. The fourth transistor can compensate variations of the base-emitter forward voltages of the third transistor induced by temperature changes, as its lower collector voltage reduces the base-emitter voltage of the third transistor in the occurrence of a temperature rise and vice versa.

In one preferred embodiment, the signal sensing circuit comprises a fifth transistor for compensation of temperature drift effects, wherein the base of the fifth transistor is connected both to the collector of the fifth transistor and to the base of the fourth transistor. The fifth transistor can compensate variations of the base-emitter forward voltages of the fourth transistor induced by temperature changes, as its lower collector voltage reduces the base-emitter voltage of the fourth transistor in the occurrence of a temperature rise and vice versa.

In another embodiment, the microcontroller is configured to carry out an equivalent time sampling method for digitally converting the voltage signal indicative of the sense current. The term "equivalent time sampling method", as used in this application, shall particularly be understood as a sampling method in which only an instantaneous input signal is measured at the sampling instant and the input signal is only sampled once per trigger. In the subsequent sampling trigger, a small timely delay is added and another sample is taken. The intended number of samples determines the resulting number of cycles needed to reproduce the input signal.

In this way, requirements on hardware properties, particularly regarding speed of signal handling and processing, can be a lowered, which results in lower hardware costs.

In one preferred embodiment, the microcontroller is configured to carry out an equivalent time sampling method by including an incremental time delay between subsequent samples that is equal to one clock period of the microcontroller. In this way, the impedance measurement can be carried out with sufficient precision in a sufficiently short time period with low-cost hardware.

In an alternative embodiment, the impedance measurement circuit further comprises a reference impedance whose impedance is a priori known, and a remotely-controllable switch connected in series to the reference impedance, wherein the reference impedance and the remotely-controllable switch are connected between the inner conductor of the shielded cable and a circuit ground. The reference impedance can be transferred between a state of being electrically connected to the inner conductor of the shielded cable and a state of being disconnected from the inner conductor of the shielded cable via the remotely-controlled switch.

As the reference impedance is known a priori and the impedance of the reference impedance can be determined by measurement with and without the reference impedance being connected to the measurement circuit, the transfer function of the signal sensing circuit can be calculated, and the measured complex impedance of the guard-sense capacitive sensor can be corrected by the calculated transfer function. In this way, the precision of the measurement can be improved.

In another aspect of the invention, a method of determining a complex impedance of a guard-sense capacitive sensor operated in loading mode is provided. The guard-sense capacitive sensor includes an electrically conductive sense electrode and an electrically conductive guard electrode proximally arranged and mutually insulated from each other.

The method comprises the following steps:
combining a plurality of synchronized output signals having a test signal frequency, the plurality of synchronized output signals being generated by at least one pulse width modulation unit, by summing the synchronized output signals;
applying low-pass filtering to the summed output signals to generate a sinusoidal test signal of test signal frequency;
simultaneously applying the test signal to the base of a first transistor configured in common base configuration and to a shield of a shielded cable, whose distal end is connected to the guard electrode;
providing a current sink to the first transistor;
converting the collector current of the first transistor by a transimpedance amplifier to a corresponding voltage at an output side of the transimpedance amplifier;
digitally converting the voltage of the output side of the transimpedance amplifier using an analog-to-digital converter; and
applying a digital demodulation method to the digitally converted voltage for determining a real part and an imaginary part of the complex impedance of the capacitive sensor.

In a suitable embodiment, the complex impedance of the guard-sense capacitive sensor operated in loading mode can be determined with little hardware effort in a fast, reliable and reproducible way.

Preferably, the step of determining the real part and the imaginary part of the complex impedance comprises steps of
multiplying an output sequence of the analog-to-digital converter unit representing the digitally converted voltage by a sine wave having a specified period;
multiplying the output sequence of the analog-to-digital converter unit representing the digitally converted voltage by a cosine wave having the specified period; and
integrating the products of both multiplications.

In this way, a simple way of determining the real part and the imaginary part of the complex impedance is provided.

In another embodiment, the method further comprises a step of multiplying the real part and the imaginary part of the determined complex impedance with a calibration vector which has been determined a priori by at least one out of circuit characterization or calibration. In this way, an additional magnitude normalization and phase correction can be done for obtaining absolute values for the real part and the imaginary part of the complex impedance.

In one embodiment of the method, the step of digitally converting comprises employing an equivalent time sampling method as described before.

In one embodiment of the method, the equivalent time sampling method is carried out by a microcontroller and includes employing an incremental time delay between subsequent samples that is equal to one period of a system clock of the microcontroller.

In one embodiment of the method, the step of digitally converting the voltage of the output side of the transimpedance amplifier comprises, in addition to digitally converting the voltage obtained with the reference impedance being electrically disconnected from a circuit ground, digitally converting the voltage obtained with a reference impedance, whose impedance is a priori known, being electrically connected between the inner conductor of the shielded cable and the circuit ground.

In another aspect of the invention, a software module is provided for carrying out steps of any embodiment of the disclosed method for determining a complex impedance of a guard-sense capacitive sensor operated in loading mode. The method steps to be conducted are converted into a program code of the software module, wherein the program code is implementable in a digital memory unit of a microcontroller and is executable by a processor unit of the microcontroller.

The software module can enable a robust and reliable execution of the method and can allow for a fast modification of method steps.

These and other aspects of the invention will be apparent from and elucidated with reference to the embodiments described hereinafter.

BRIEF DESCRIPTION OF THE DRAWINGS

Further details and advantages of the present invention will be apparent from the following detailed description of a not limiting embodiment with reference to the attached drawings, in which.

DETAILED DESCRIPTION OF PREFERRED EMBODIMENTS

In the following, embodiments in accordance with the invention are disclosed.

The individual embodiments are described with reference to a particular figure and are identified by a prefix number of the particular embodiment. Features whose function is the same or basically the same in all embodiments are identified by reference numbers made up of the prefix number of the embodiment to which it relates, followed by the number of the feature. If a feature of an embodiment is not described in the corresponding figure depiction, or a reference number mentioned in a figure depiction is not shown in the figure itself, the description of a preceding embodiment should be referred to.

Figure 1:
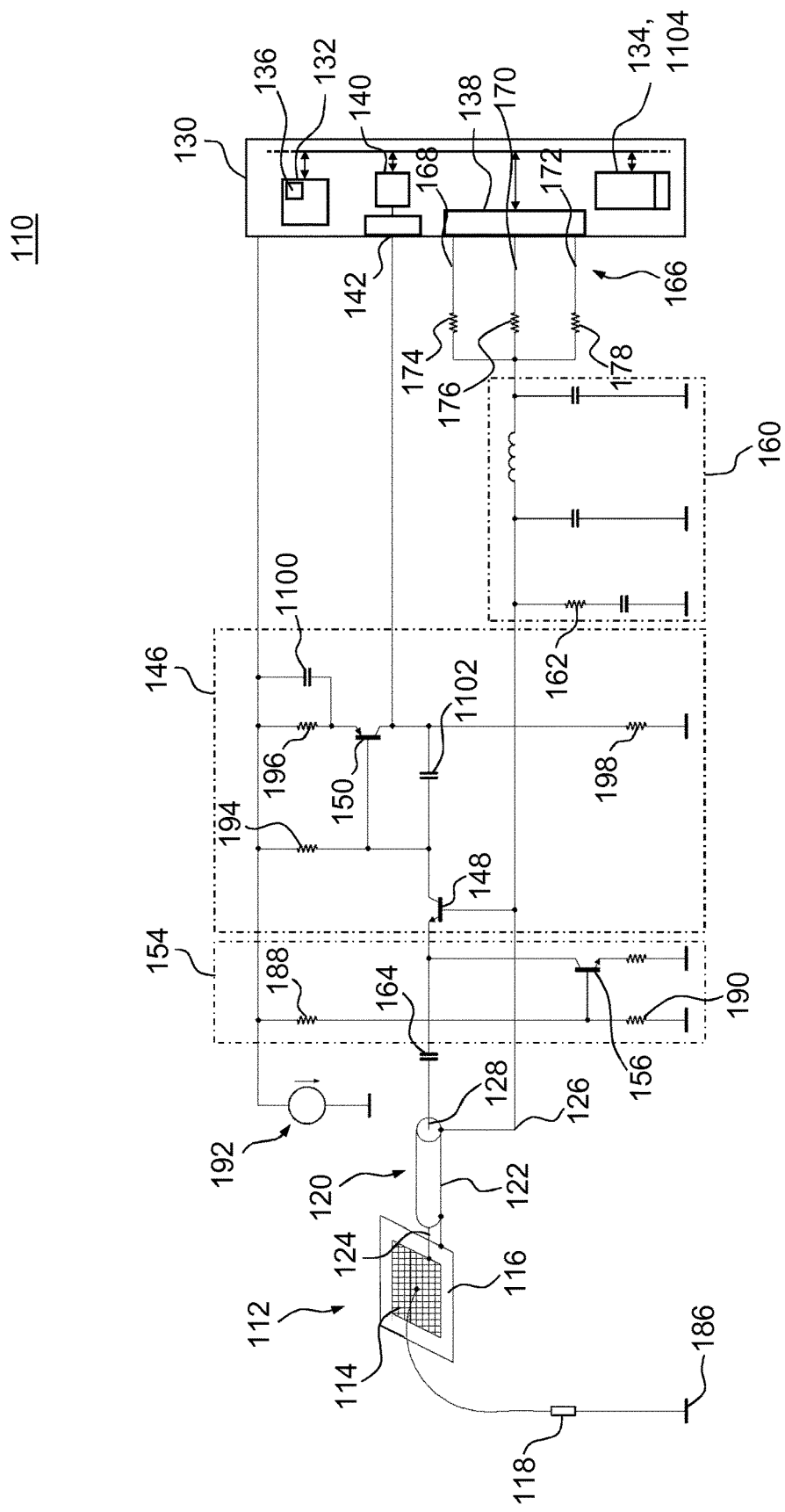
FIG. 1 shows a layout of an embodiment of an impedance measurement circuit in accordance with the invention.

FIG. 1 shows a layout of an embodiment of an impedance measurement circuit 110 for determining a complex impedance of a guard-sense capacitive sensor 112 operated in loading mode, in accordance with the invention.

The impedance measurement circuit 110 includes a guard-sense capacitive sensor 112 including an electrically conductive sense electrode 114 and an electrically conductive guard electrode 116 proximally arranged to and mutually insulated from each other. An approaching object of unknown impedance 118, for instance a seat occupant, electrically interacts with the guard-sense capacitive sensor 112 and, by that, changes the complex impedance of the guard-sense capacitive sensor 112, which is sensed by the impedance measurement circuit 110. The interaction between the unknown impedance 118 and the guard-sense capacitive sensor 112 is indicated in FIG. 1 by a curved solid line emerging from the unknown impedance 118 and ending at the sense electrode 114.

The impedance measurement circuit 110 comprises a microcontroller 130 that includes a processor unit 132, a digital memory unit 134, a microcontroller system clock 136, a plurality of three synchronized pulse width modulation (PWM) units 138 with square wave output signals 168, 170, 172 and an analog-to-digital converter unit 140. It is understood that data links (indicated in FIG. 1 as a data bus) exist that mutually connect the various components of the microcontroller 130. The microcontroller 130 is preferably of a low-cost type with limited capabilities.

The impedance measurement circuit 110 further comprises a pulse generator unit 166 that is configured to weight and to sum output signals 168, 170, 172 of the plurality of synchronized PWM units 138 having one test signal frequency. The adjustable test signal frequency generally lies in a range between 10 kHz and 500 kHz, and is selected in this specific embodiment to be 100 kHz.

The pulse generator unit 166 comprises three resistors 174, 176, 178, each resistor 174, 176, 178 being connected to an output port of one of the three PWM units 138, for weighted summing of all the PWM unit output signals 168, 170, 172.

Figure 2:
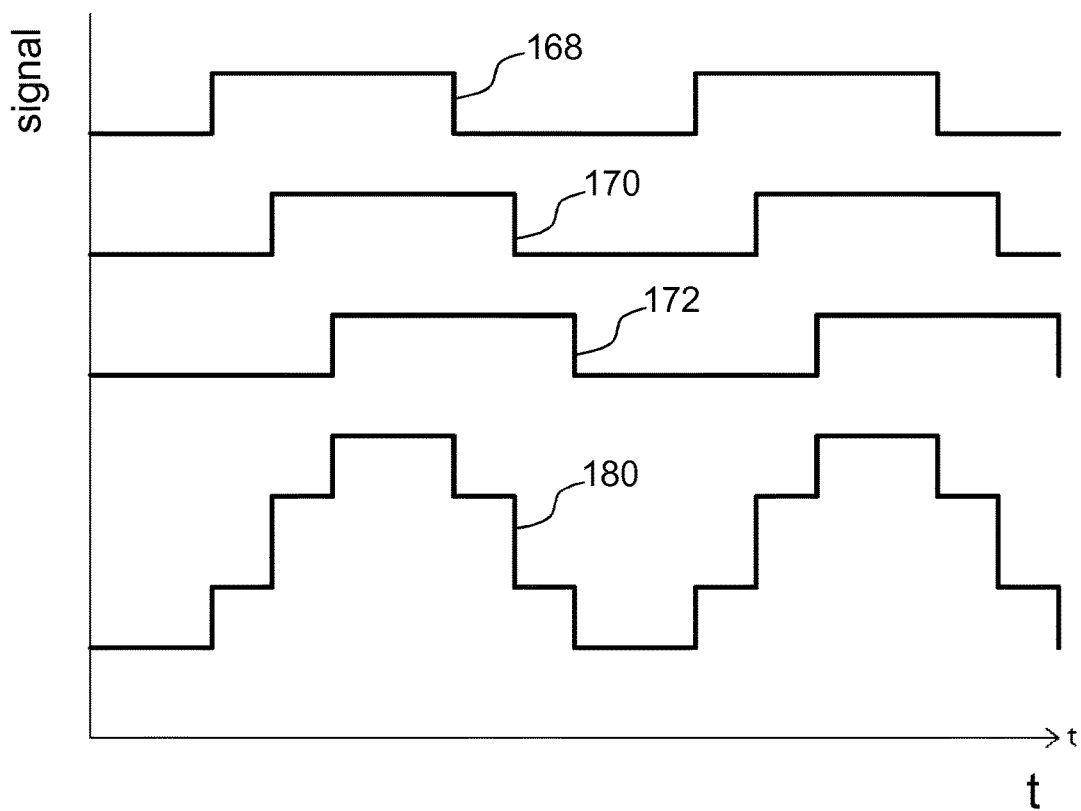
FIG. 2 shows a combination of a plurality of synchronized output signals of same test signal frequency, generated by synchronized pulse width modulation units of the microcontroller of the impedance measurement circuit pursuant to FIG. 1.

The square wave output signals 168, 170, 172 of the pulse width modulation units 138 are schematically shown in FIG. 2. The output signals 168, 170, 172 have the same test signal frequency, with a defined relative phase shift among them. PWM unit output signal 170 is delayed by ⅛ period relative to PWM unit output 168, and PWM unit output signal 172 in turn is delayed by ⅛ period relative to PWM unit output signal 170. The relative amplitudes of the PWM unit output signals 168, 170, 172 as weighted by the resistors 174, 176, 178 are 1, √2 and 1, respectively. By summing the weighted PWM unit output signals 168, 170, 172, an approximated sine wave 180 is generated as indicated in the bottom part of FIG. 2. The $2^{nd}$ to $7^{th}$ harmonics of the approximated sine wave 180 are substantially suppressed.

A low-pass filter unit 160, designed as an LC-filter in π-configuration, is connected in series to the output of the pulse generator unit 166 and substantially filters out most of the remaining harmonics. The output of the low-pass filter unit 160 is a sinusoidal test signal having a frequency of 100 kHz and a low distortion factor. The source resistance of the low-pass filter unit 160 is defined by the three resistors 174, 176, 178, and resistor 162 defines the load resistance of the low-pass filter unit 160.

The impedance measurement circuit 110 further includes a signal sensing circuit 146 including a first transistor 148 configured in common base configuration, having an input side and an output side, and providing a low input impedance to the sense electrode 114. A second transistor 150 of the signal sensing circuit 146 is configured in common emitter configuration, having an input side and an output side and serves as a transimpedance amplifier for a signal at the output side of the first transistor 148. An output line of the low-pass filter unit 160 carrying the sinusoidal test signal is connected to the base of the first transistor 148.

A shielded cable 120 connects the sense electrode 114 and the guard electrode 116 with terminals of the input side of the first transistor 148. The shielded cable 120 is formed by a coaxial cable and comprises a shield 122 and an inner conductor 124. The guard electrode 116 is connected with the base of the first transistor 148 by the shield 122 of the shielded cable 120, and, as mentioned above, with the output line of the low-pass filter unit 160, defining a guard node 126. The sense electrode 114 is connected with the emitter of the first transistor 148 by the inner conductor 124 of the shielded cable 120 via a capacitor 164 for direct current (DC) decoupling. The capacitor 164 is arranged between the emitter of the first transistor 148 and an end of the inner conductor 124 of the shielded cable 120 that is proximal to the input side of the first transistor 148 and defines a sense node 128. A capacitance value of the capacitor 164 is selected such that at the test frequency, the impedance of the capacitor 164 is low enough to let a signal pass substantially unattenuated. The capacitor 164 eliminates the influence of leakage currents between the sense electrode 114 and a circuit ground 186 on the DC bias setting of the signal sensing circuit 146.

Further, the impedance measurement circuit 110 includes a DC bias circuit 154 which comprises a third transistor 156 that is connected to the first transistor 148 for providing a current sink to the first transistor 148. The DC bias circuit 154 includes a voltage divider comprising two resistors 188, 190 connected in series between a DC voltage source 192 and the circuit ground 186 for controlling the base-emitter voltage of the third transistor 156 in an operational state of the DC bias circuit 154. The collector of the third transistor 156 is connected to the emitter of the first transistor 148. An additional resistor 194 of the signal sensing circuit 146 sets the DC collector voltage of the first transistor 148 by connecting the collector to a high-voltage end of the DC voltage source 192.

The base of the first transistor 148 is driven by the test signal voltage, and as the alternate current (AC) emitter voltage of the first transistor 148 is substantially the same as the base voltage, the voltage at the sense node 128 is therefore substantially identical to the voltage at the guard node 126. This is important to eliminate substantially all the influence of parasitic capacitance between the sense node 128 and the guard node 126, for example due to the inter-electrode sensor capacitance, or the capacitance of the shielded cable 120. If the voltages at the sense node 128 and the guard node 126 were substantially different, an unknown sense current to be measured would flow through the capacitance between sense electrode 114 and guard electrode 116, and then into the circuit ground 186, instead of entering the signal sensing circuit 146 at the sense node 128, resulting in a substantial measurement error.

The AC collector current of the first transistor 148 is substantially equal to the unknown sense current to be measured. It is transformed into a proportional AC voltage with the trans-impedance amplifier formed by the second transistor 150, two resistors 196, 198 and two capacitors 1100, 1102. The resistors 196, 198, together with the base voltage of the second transistor 150, define the DC bias voltages and currents of the second transistor 150. The base voltage has been defined above as it is equal to the collector voltage of the first transistor 148. The first capacitor 1100 of the two capacitors 1100, 1102 provides an AC bypass in parallel to resistor 196, increasing the AC gain of the second transistor 150 connected in common emitter configuration. The feedback loop of the transimpedance amplifier is made out of the second transistor 150, providing negative voltage gain, and the second capacitor 1102 of the two capacitors 1100, 1102 which serves as a feedback capacitor. Feedback capacitor 1102 substantially defines the transimpedance of the transimpedance amplifier. The output voltage at the collector of the second transistor 150 is connected to an input port 142 of the analog-two-digital converter (ADC) unit 140 of the microcontroller 130. The DC voltage source 192 provides the power to the signal sensing circuit 146 and to the microcontroller 130.

Figure 4:
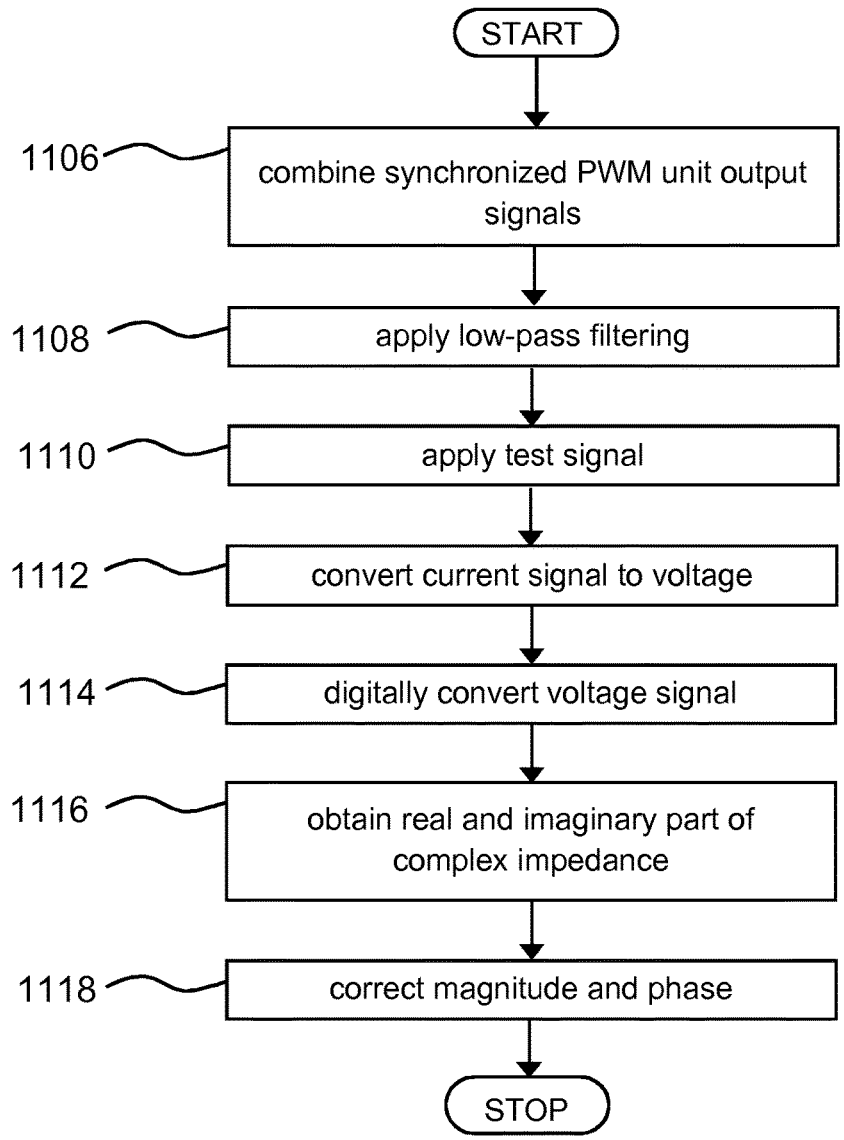
FIG. 4 is a flowchart of an embodiment of a method in accordance with the invention.

In the following, an embodiment of a method of determining a complex impedance of a guard-sense capacitive sensor operated in loading mode is described (FIG. 4). In preparation of measuring the impedance of the guard-sense capacitive sensor 112 by the embodiment of the impedance measurement circuit 110 pursuant to FIG. 1, it shall be understood that all involved units and devices are in an operational state and configured as illustrated in FIG. 1.

In order to be able to carry out the method, the microcontroller 130 comprises a software module 1104. Method steps to be conducted are converted into a program code of the software module 1104, wherein the program code is implementable in the digital memory unit 134 of the microcontroller 130 and is executable by the processor unit 132 of the microcontroller 130. In particular, the microcontroller 130 is configured to apply a vector demodulation method to a voltage signal that is indicative of a sense current and digitally converted by the analog-to-digital converter unit 140, for determining a real part and an imaginary part of the complex impedance of the guard-sense capacitive sensor 112 operated in loading mode.

In one step 1106 of the method, a plurality of three synchronized output signals 168, 170, 172 having a test signal frequency, the plurality of synchronized output signals 168, 170, 172 being generated by three pulse width modulation (PWM) units 138, is combined by electronically summing the synchronized output signals 168, 170, 172.

In a next step 1108 then, low-pass filtering is applied to the summed output signals to generate a sinusoidal test signal having the test signal frequency.

In another step 1110, the test signal is simultaneously applied to the base of the first transistor 148 and to the shield 122 of the shielded cable 120, whose distal end is connected to the guard electrode 116.

In the next step 1112 of the method, the collector current of the first transistor 148 is converted by the transimpedance amplifier to a corresponding voltage at the output side of the second transistor 150.

In a following step 1114, the voltage at the output side of the second transistor 150 is provided to the input port 142 of the analog-to-digital converter unit 140 of the microcontroller 130.

While the voltage at the output side of the second transistor 150 is connected to the input port 142 of the analog-to-digital converter unit 140, an equivalent time sampling method is employed as follows.

In order to sample the signals at the input port 142 of the analog-to-digital converter unit 140, a specified number of samples per period of the test signal frequency is required, preferably more than 100 samples per period, for achieving a sufficient precision of the impedance measurement. However, the test signal frequency is at 100 kHz, and sampling 100 times per test signal period would imply a sampling frequency of 10 MHz, which is not feasible with the low-cost microcontroller contemplated for the embodiments disclosed herein.

In the equivalent time sampling approach, the analog-to-digital converter trigger signal has a frequency which is equal to the test signal frequency plus or minus a difference frequency. The analog-to-digital converter trigger period is chosen to be one period of the microcontroller system clock 136 longer than the test signal frequency clock period. Thereby, the analog-to-digital converter sample advances one microcontroller clock period for each test signal period.

Without any loss of generality it shall be assumed that the first analog-to-digital converter sampling occurs exactly at the beginning of the first test signal period. In the subsequent test signal period, the second analog-to-digital converter sampling will occur at the start of the second test signal period plus one microcontroller clock period, and so on. The microcontroller 130 of the embodiment has a system clock 136 with a frequency of for example 16 MHz. As the test signal frequency is 100 kHz, there will have passed exactly 16 MHz/100 kHz=160 test signal periods (or 1.6 ms) until the analog-to-digital converter sampling coincides again with the beginning of a test signal period. Thereby, the analog-to-digital converter unit 140 has sampled one full test signal period in an equivalent way, with 160 samples taken for one full test signal period. In this embodiment, the processor unit 132 of the microcontroller 130 is configured to sample a plurality of four test signal periods, i.e. 640 samples, and to store the determined data in the microcontroller digital memory unit 134.

Then, in the next step 1116, the ADC sequence representing the voltage at the output side of the second transistor 150 is multiplied firstly by a sine wave having a period of 160 samples, and secondly by a cosine wave having a period of 160 samples. Then, each of the products of both multiplications is integrated, and the integration results are indicative of the real part and the imaginary part of the complex impedance measurement.

In order to calculate absolute values of the real and imaginary parts of the complex impedance of the guard-sense capacitive sensor 112 operated in loading mode, there is an additional magnitude normalization and phase correction performed in an additional step 1118 of the method. This can be carried out, for instance, by multiplying the real part and the imaginary part of the complex impedance measurement with a calibration vector determined a priori, either by circuit characterization or by calibration.

Figure 3:
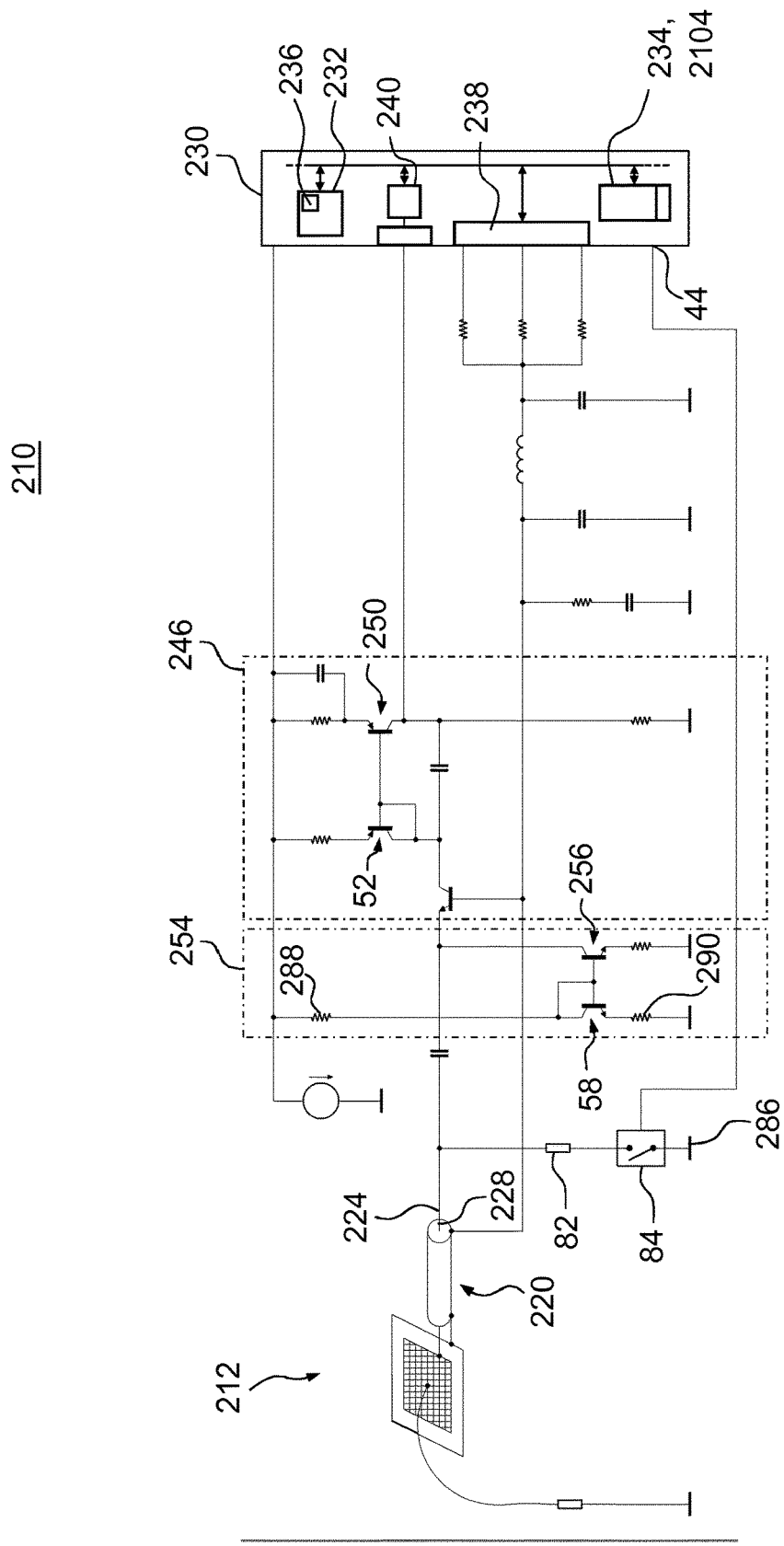
FIG. 3 shows a layout of an alternative embodiment of an impedance measurement circuit in accordance with the invention.

A layout of another embodiment of an impedance measurement circuit 210 for determining a complex impedance of a guard-sense capacitive sensor 212 operated in loading mode is illustrated in FIG. 3. Only features differing from the embodiment pursuant to FIG. 1 will be described. For features of the second embodiment that are not described hereinafter, reference is made to the description of the first embodiment.

In comparison to the first embodiment (FIG. 1), the DC bias circuit 254 further comprises a fourth transistor 58 for compensation of temperature drift effects. The fourth transistor 58 is connected in series between the two resistors 288, 290 of the voltage divider, and the base of the fourth transistor 58 is connected both to the collector of the fourth transistor 58 and to the base of the third transistor 256.

Moreover, the signal sensing circuit 246 comprises a fifth transistor 52 for compensation of temperature drift effects. The base of the fifth transistor 52 is connected both to the collector of the fifth transistor 52 and to the base of the second transistor 250.

Both the fourth transistor 58 and the fifth transistor 52 compensate variations of the base-emitter forward voltages of the third transistor 256 and second transistor 250, respectively, by reducing the base-emitter voltage with a lowered collector voltage in the occurrence of a temperature rise and vice versa.

In addition, the impedance measurement circuit 210 further comprises a reference impedance 82 whose impedance is a priori known, and a remotely-controllable switch 84 connected in series to the reference impedance 82. The remotely-controllable switch 84 is connected to an actuator port 44 of the microcontroller 230 and controlled by the microcontroller 230. The reference impedance 82 and the remotely-controllable switch 84 are connected between the inner conductor 224 of the shielded cable 220, close to the sense node 228, and the circuit ground 286.

The method of measuring the complex impedance of the guard-sense capacitive sensor 212 operated in loading mode with the embodiment of an impedance measurement circuit 210 pursuant to FIG. 3 has to be modified as follows:

The step of digitally converting the voltage of the output side of the transimpedance amplifier comprises, in addition to digitally converting the voltage of the output side of the transimpedance amplifier obtained with the reference impedance 82 being electrically disconnected from the circuit ground 286, digitally converting the voltage of the output side of the transimpedance amplifier obtained with the reference impedance 82 being electrically connected between the inner conductor 224 of the shielded cable 220 and the circuit ground 286.

The impedance value of the reference impedance 82 is measured by taking the difference between the measurement result with the remotely-controllable switch 84 in a closed position and the measurement result when the remotely-controllable switch 84 is in an open position. As the impedance value of the reference impedance 82 is known a priori and stored in the digital memory unit 234 of the microcontroller 230, and the impedance value of the reference impedance 82 has been determined by measurement, the transfer function of the signal sensing circuit 246 can be calculated, and the measurement impedance of the unknown impedance 218 can be corrected by the calculated transfer function.

In the above disclosed embodiments of the invention three PWM outputs have been used for the sine wave generation. It should however be noted that the sine wave generation does not necessarily require three outputs. If more or less distortion is allowed for the sine wave, then any number greater or equal to one of PWM outputs can be used with appropriate phase shifts in between and appropriate resistive weighting.

While the invention has been illustrated and described in detail in the drawings and foregoing description, such illustration and description are to be considered illustrative or exemplary and not restrictive; the invention is not limited to the disclosed embodiments.

Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

The invention claimed is:

1. An impedance measurement circuit for determining a complex impedance of a guard-sense capacitive sensor operated in loading mode, comprising a guard-sense capacitive sensor including an electrically conductive sense electrode and an electrically conductive guard electrode proximally arranged and mutually insulated from each other;

a signal sensing circuit including a first transistor configured in common base configuration, having an input side and an output side, and a second transistor configured in common emitter configuration, having an input side and an output side and serving as a transimpedance amplifier for a signal at the output side of the first transistor; said sense electrode and said guard electrode being connected with terminals of the input side of the first transistor;

a direct current bias circuit comprising at least a third transistor that is connected to the first transistor for providing a current sink to the first transistor;

a microcontroller, including
a processor unit,
a digital memory unit,
a microcontroller system clock,
a plurality of synchronized pulse width modulation units, and
an analog-to-digital converter unit;

a pulse generator unit that is configured to weight and to sum output signals of the plurality of synchronized pulse width modulation units, said output signals having a test signal frequency and said output signals exhibiting a defined relative phase shift between each other;

a low-pass filter unit that is connected in series to an output of the pulse generator unit and that is configured to filter the summed output signals for generating a sinusoidal test signal of the test signal frequency at the output of the low-pass filter unit;

wherein an output line of the low-pass filter unit is connected to the base of the first transistor, wherein the output side of the second transistor is connected to the analog-to-digital converter unit, and wherein the microcontroller is configured to apply a digital vector demodulation method to a voltage signal that is indicative of a sense current and digitally converted by the analog-to-digital converter unit, for determining a real part and an imaginary part of the complex impedance of the capacitive sensor, said digital vector demodulation method being executed by software within said microcontroller.

2. The impedance measurement circuit as claimed in claim 1, wherein said sense electrode and said guard electrode are connected with the terminals of the input side of the first transistor by means of a shielded cable and wherein the shielded cable comprises a shield and at least one inner conductor, and wherein the guard electrode is connected with the base of the first transistor by the shield of the shielded cable, and the sense electrode is connected with the emitter of the first transistor by the at least one inner conductor of the shielded cable.

3. The impedance measurement circuit as claimed in claim 2, wherein a capacitor for direct current decoupling is installed between the input side of the first transistor and an end of the inner conductor of the shielded cable that is proximal to the input side of the first transistor.

4. The impedance measurement circuit as claimed in claim 1, wherein the direct current bias circuit includes a voltage divider comprising at least two resistors for controlling the base-emitter voltage of the third transistor in an operational state of the direct current bias circuit, wherein the collector of the third transistor is connected to the emitter of the first transistor.

5. The impedance measurement circuit as claimed in claim 4, wherein the direct current bias circuit further comprises a fourth transistor for compensation of temperature drift effects, wherein
the fourth transistor is connected in series between the at least two resistors of the voltage divider, and
the base of the fourth transistor is connected both to the collector of the fourth transistor and to the base of the third transistor.

6. The impedance measurement circuit as claimed in claim 1, wherein the signal sensing circuit comprises a fifth transistor for compensation of temperature drift effects, wherein the base of the fifth transistor is connected both to the collector of the fifth transistor and to the base of the second transistor.

7. The impedance measurement circuit as claimed in claim 1, wherein the microcontroller is configured to carry out an equivalent time sampling method for digitally converting the voltage signal indicative of the sense current.

8. The impedance measurement circuit as claimed in claim 1, wherein the microcontroller is configured to apply said digital vector demodulation by
multiplying an output sequence of the analog-to-digital converter unit representing the digitally converted voltage by a sine wave having a specified period;
multiplying the output sequence of the analog-to-digital converter unit representing the digitally converted voltage by a cosine wave having the specified period; and
integrating the products of both multiplications.

9. The impedance measurement circuit as claimed in claim 2, further comprising a reference impedance and a remotely-controllable switch connected in series to the reference impedance, wherein the reference impedance and the remotely-controllable switch are connected between the inner conductor of the shielded cable and a circuit ground.

10. A method of determining a complex impedance of a guard-sense capacitive sensor operated in loading mode, the guard-sense capacitive sensor including an electrically conductive sense electrode and an electrically conductive guard electrode proximally arranged and mutually insulated from each other, and the method comprising the following steps:
combining a plurality of synchronized output signals having a test signal frequency and exhibiting a defined relative phase shift between each other, the plurality of synchronized output signals being generated by at least one pulse width modulation unit, by summing the synchronized output signals;
applying low-pass filtering to the summed output signals to generate a sinusoidal test signal of test signal frequency;
simultaneously applying the test signal to the base of a first transistor configured in common base configuration and to a shield of a shielded cable, whose distal end is connected to the guard electrode;
providing a current sink to the first transistor;
converting the collector current of the first transistor by a transimpedance amplifier to a corresponding voltage at an output side of the transimpedance amplifier;
digitally converting the voltage at the output side of the transimpedance amplifier using an analog-to-digital converter unit;
applying a digital demodulation method to the digitally converted voltage for determining a real part and an imaginary part of the complex impedance of the guard-sense capacitive sensor operated in loading mode, said digital demodulation method being executed by software within a microcontroller.

11. The method as claimed in claim 10, wherein the step of determining the real part and the imaginary part of the complex impedance comprises steps of
multiplying an output sequence of the analog-to-digital converter unit representing the digitally converted voltage by a sine wave having a specified period;
multiplying the output sequence of the analog-to-digital converter unit representing the digitally converted voltage by a cosine wave having the specified period; and
integrating the products of both multiplications.

12. The method as claimed in claim 10, further comprising a step of multiplying the real part and the imaginary part of the determined complex impedance with a calibration vector which has been determined a priori by at least one out of circuit characterization or calibration.

13. The method as claimed in claim 10, wherein the step of digitally converting comprises employing an equivalent time sampling method.

14. The method as claimed in claim 13, wherein the equivalent time sampling method is carried out by the microcontroller and includes employing an incremental time delay between subsequent samples that is equal to one period of a system clock of the microcontroller.

15. The method as claimed in claim 10, wherein the step of digitally converting the voltage of the output side of the transimpedance amplifier comprises, in addition to digitally converting the voltage of the output side of the transimpedance amplifier obtained with the reference impedance being electrically disconnected from a circuit ground, digitally converting the voltage of the output side of the transimpedance amplifier obtained with the reference impedance, whose impedance is a priori known, being electrically connected between the inner conductor of the shielded cable and the circuit ground.

16. A non-transitory digital memory unit storing computer-readable program code executable by a processor unit of a microcontroller for determining a complex impedance of a guard-sense capacitive sensor operated in loading mode, the guard-sense capacitive sensor including an electrically conductive sense electrode and an electrically conductive guard electrode proximally arranged and mutually insulated from each other, wherein the executable program code is configured to:
combine a plurality of synchronized output signals having a test signal frequency and exhibiting a defined relative phase shift between each other, the plurality of synchronized output signals being generated by at least one pulse width modulation unit, by summing the synchronized output signals;
apply low-pass filtering to the summed output signals to generate a sinusoidal test signal of test signal frequency;
simultaneously apply the test signal to the base of a first transistor configured in common base configuration and to a shield of a shielded cable, whose distal end is connected to the guard electrode;
provide a current sink to the first transistor;
convert the collector current of the first transistor by a transimpedance amplifier to a corresponding voltage at an output side of the transimpedance amplifier;
digitally convert the voltage at the output side of the transimpedance amplifier using an analog-to-digital converter unit; and
apply a digital demodulation method to the digitally converted voltage for determining a real part and an imaginary part of the complex impedance of the guard-sense capacitive sensor operated in loading mode, said digital demodulation method being executed by software within the microcontroller.

\* \* \* \* \*